United States Patent
Nazarov

(10) Patent No.: US 9,324,020 B2
(45) Date of Patent: Apr. 26, 2016

(54) ANTENNA STRUCTURES AND METHODS FOR OMNI DIRECTIONAL RADIATION PATTERNS

(75) Inventor: Alexey Nazarov, Judendorf-Strassengel (AT)

(73) Assignee: NXP B.V., Eindhoven (NL)

( * ) Notice: Subject to any disclaimer, the term of this patent is extended or adjusted under 35 U.S.C. 154(b) by 670 days.

(21) Appl. No.: 13/599,201

(22) Filed: Aug. 30, 2012

(65) Prior Publication Data

US 2014/0062787 A1 Mar. 6, 2014

(51) Int. Cl.
| | |
|---|---|
| G06K 19/18 | (2006.01) |
| G06K 19/077 | (2006.01) |
| G06K 19/073 | (2006.01) |
| H01Q 1/22 | (2006.01) |
| H01Q 1/38 | (2006.01) |
| H01Q 9/26 | (2006.01) |
| H01Q 9/28 | (2006.01) |
| H01Q 21/20 | (2006.01) |
| H01Q 25/00 | (2006.01) |

(52) U.S. Cl.
CPC .... G06K 19/07794 (2013.01); G06K 19/07372 (2013.01); G06K 19/07786 (2013.01); G06K 19/07798 (2013.01); H01Q 1/2225 (2013.01); H01Q 1/38 (2013.01); H01Q 9/26 (2013.01); H01Q 9/285 (2013.01); H01Q 21/205 (2013.01); H01Q 25/00 (2013.01)

(58) Field of Classification Search
CPC ................. G06K 19/07786; G06K 19/07779; G06K 19/0775; G06K 19/07794; H01Q 21/29
See application file for complete search history.

(56) References Cited

U.S. PATENT DOCUMENTS

| | | | | |
|---|---|---|---|---|
| 4,710,775 | A * | 12/1987 | Coe | 343/727 |
| 5,572,226 | A * | 11/1996 | Tuttle | 343/726 |
| 5,751,252 | A * | 5/1998 | Phillips | 343/726 |
| 6,278,413 | B1 * | 8/2001 | Hugh et al. | 343/818 |
| 7,772,974 | B2 * | 8/2010 | Ehrensvard et al. | 340/572.1 |
| 7,932,589 | B2 * | 4/2011 | Yamazaki et al. | 257/684 |
| 2002/0036237 | A1 * | 3/2002 | Atherton et al. | 235/492 |
| 2002/0109636 | A1 * | 8/2002 | Johnson et al. | 343/742 |
| 2005/0040994 | A1 * | 2/2005 | Mazoki et al. | 343/809 |
| 2005/0242959 | A1 * | 11/2005 | Watanabe | 340/572.7 |
| 2012/0018505 | A1 * | 1/2012 | Jiang et al. | 235/375 |
| 2012/0145794 | A1 * | 6/2012 | Mieslinger | 235/488 |

FOREIGN PATENT DOCUMENTS

| | | |
|---|---|---|
| EP | 2 251 933 A1 | 11/2010 |
| WO | 2005/024745 A2 | 3/2005 |
| WO | WO-2006046157 A * | 5/2006 ........... G06K 19/077 |

OTHER PUBLICATIONS

Impinj Monza 3 Datasheet Rev 1.0 Oct. 30, 2008, pp. 1-13.*

(Continued)

Primary Examiner — Gregory C Issing

(57) ABSTRACT

A device is provided for use with a radio frequency identification (RFID) chip that receives and modulates a radio frequency (RF) signal. A substrate of the device includes a first short dipole antenna structure that backscatters a received RF signal to produce a first radiation pattern having nulls. A set of connection pads couple the RF signal from the antenna to a frontend transmitter circuit of the RFID chip. A second antenna structure backscatters the received RF signal by electromagnetic coupling to the first antenna structure and produces a second radiation pattern that complements the nulls in the first radiation pattern.

20 Claims, 6 Drawing Sheets

(56) References Cited

OTHER PUBLICATIONS

Radio Frequency Identification: Applications and Implications for Consumers, Federal Trade Commission, Mar. 2005.
NXP, SL3S1203__1213, UCODE G2iL and G2iL+, Product Data Sheet, Rev. 4—Feb. 27, 2012.
http://www.impinj.com/products/SubOneCol.aspx?id=4527 &terms=tag+antenna; True3DTM Antenna Technology.
Extended European Search Report for Patent Appln. No. 13181742.1 (Nov. 19, 2013).
Impinj Inc., Monza® 4 UHF Gen 2 RFID Tag Chips with TRUE 3D™ and QT™ Technologies, 2010.

\* cited by examiner

US 9,324,020 B2

ANTENNA STRUCTURES AND METHODS FOR OMNI DIRECTIONAL RADIATION PATTERNS

Aspects of the present disclosure relate to apparatuses, devices, and methods involving radio frequency (RF) communications and more particularly to antenna structures for use with RF communications.

Ultrahigh frequency (UHF), around 300 MHz to 3 GHz, radio frequency (RF) identification (RFID) devices have a variety of different applications. In certain instances, an item is tagged with a tiny integrated circuit (IC) chip. The chip can be connected to an antenna, which might be fabricated on a substrate, such as a thin polyethylene terephtalate (PET) substrate. The combination chip and antenna (together called a "tag") allows a reader device to access data stored on the chip. For instance, a unique identifier (ID) can be accessed to facilitate the individual tagging/identification of items by a reader device. For example, each particular saleable good in a store can have its relevant parameters (model number, color, size, etc.) read electronically from a tag. Vehicles with RFID tags can be identified and charged for use of highway tollbooths, saving time and reducing traffic congestion. Devices or animals can be implanted with chips for tracking so that if lost, they can be easily returned to their owners. Depending upon the particular application, a reader device can scan the tag to access the data that it stores. This information can be processed by the reader device, stored in a database or otherwise communicated and processed.

Many RFID devices provide a small, robust and cheap solution for RF communications of relatively small amounts of data. This facilitates their use on a large scale, in rugged conditions and in unobtrusive/space-limited locations. Notwithstanding, there can be competing desires for maintaining or improving these aspects while providing additional functionality and/or flexibility. This can be particularly true with regard to transmission circuits and associated antenna solutions.

Consistent therewith, various embodiments of the present disclosure are directed toward antenna devices, communication/transmission circuits and associated methods, which can be applicable for RFID solutions.

Aspects of the present disclosure are directed to systems and methods useful for RFID communications in multiple directions. These and other aspects of the present disclosure are exemplified in a number of illustrated implementations and applications, some of which are shown in the figures and characterized in the claims section that follows.

A device is provided for use with a radio frequency identification (RFID) chip that receives and modulates a radio frequency (RF) signal. A substrate (e.g., a thin PET substrate) of the device includes a first short dipole antenna structure that backscatters a received RF signal to produce a first radiation pattern having nulls. A set of connection pads couples the RF signal from the antenna to a frontend transmitter circuit of the RFID chip. A second antenna structure backscatters the received RF signal by electromagnetic coupling to the first antenna structure and produces a second radiation pattern that complements the nulls in the first radiation pattern.

Certain embodiments relate to a method for providing directionally insensitivity radiation in patterns. The method is carried out by receiving and modulating a radio frequency (RF) signal using a RFID frontend circuit. The modulated RF signal is backscattered using a first short dipole antenna structure that is configured to produce a first radiation pattern having nulls. The modulated RF signal is also backscattered by electromagnetically coupling a second antenna structure to the first antenna structure to produce a second radiation pattern that complements the nulls in the first radiation pattern.

The above discussion is not intended to describe each embodiment or every implementation of the present disclosure. The figures, detailed description, and claims that follow more particularly exemplify various embodiments.

Aspects of the present disclosure may be more completely understood in consideration of the detailed description of various embodiments of the present disclosure that follows in connection with the accompanying drawings, in which.

Figure 1:
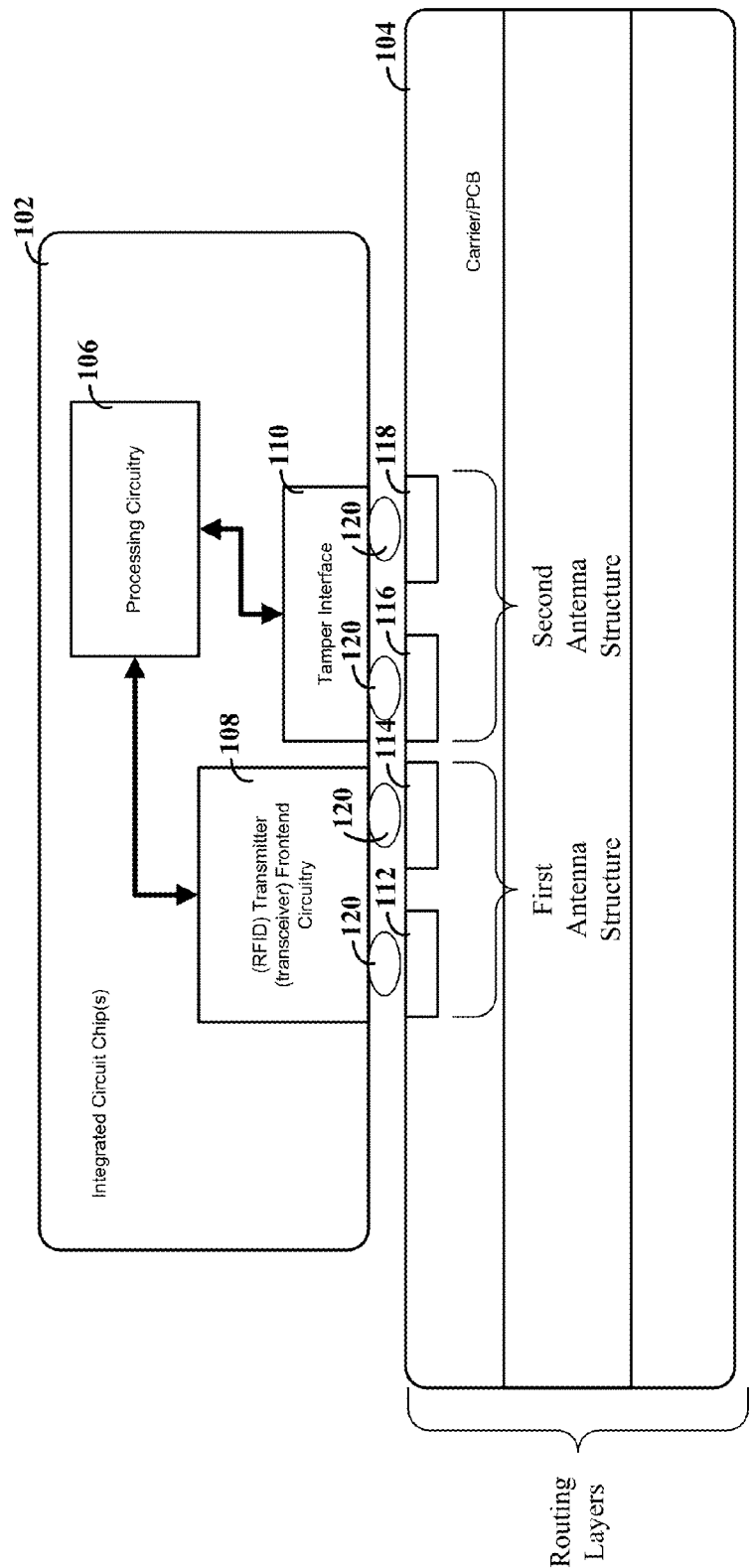
FIG. 1 depicts a block diagram of a system for RFID transmissions, consistent with embodiments of the present disclosure.

While the disclosure is amenable to various modifications and alternative forms, specifics thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims.

Aspects of the present disclosure are believed to be applicable to a variety of different types of devices, systems and arrangements, including those that may be implemented in connection with an RFID solution and associated antenna structure(s). While the present disclosure is not necessarily limited to such applications, various aspects of the invention may be appreciated through a discussion of various examples using this context.

Embodiments of the present disclosure are directed toward wireless communication solutions that use an antenna structure that functions as an electrically short dipole antenna. As used herein, an electrically short dipole antenna can have a length shorter than half a wavelength (including lengths that are less a tenth of a wavelength) and includes two rods connected to a transmission line at the center. A more complex dipole antenna is a folded dipole antenna, in which the two ends of the transmission lines are connected to complete a conductor loop. Other types of dipole antennas include unequal conductor folded dipoles, and multi-wire folded dipoles. Dipole antennas can be relatively easy to construct, model and design. They can also be readily implemented in substantially one or two dimensions (e.g., on a single layer of a printed circuit board (PCB)) and within a relatively small space. Aspects of the present disclosure relate to the recognition that, while a dipole antenna structure can provide certain benefits, a dipole antenna structure can be limited by the directional properties of its antenna gain. Accordingly, embodiments of the present disclosure are directed toward complementing dipole radiation patterns (produced by a dipole antenna) using a second antenna structure. The radiation patterns discussed herein can be relevant to both receipt and transmission of data. For instance, receipt of an RF signal from a reader device can be directionally limited by the radiation pattern in a manner similar to that of transmission, e.g., a transmission that uses backscattering of the RF signal after being modulated to convey data. Accordingly, the radiation patterns discussed herein are not limited to just transmission (or receipt) of data, unless otherwise specified.

Embodiments are directed toward a device for use with a RFID chip that receives, modulates and then uses antenna structures to backscatter a RF signal. The device has a substrate that contains a first antenna structure configured and arranged to produce a first radiation pattern having nulls. A particular type of substrate is a (thin) PET substrate. Although not necessarily limited thereto, various embodiments are discussed as using such a (thin) PET substrate. As discussed herein, a null represent portions of the radiation pattern having antenna gain without consequence or significance relative to the overall radiation pattern. Thus, a null can have a minor, inconsequential, amount of radiated signal strength. The PET substrate can include a set of connection pads configured and arranged to receive the RF signal and provide the RF signal to the antenna structure. A second antenna structure is configured and arranged to receive the RF signal using electromagnetic coupling with the first antenna structure and to produce a second radiation pattern that complements the nulls in the first radiation pattern. The resulting radiation pattern thereby provides increased antenna gain for the direction corresponding to the nulls. Through the use of electromagnetic coupling, the RFID chip can be configured as a single frontend transmission device that is directly connected (via a current path) to the first antenna structure, but not a second antenna structure. In this manner, the second antenna structure does not need to be linked using a conductor that provides current from a (second) transmitter circuit.

Certain embodiments are directed toward the second antenna structure being configured for multiple purposes. In particular, the device can be designed to use the second antenna structure for tamper protection. In certain applications, the second antenna structure can be configured to function in connection with a safety seal. For instance, a protection label can be placed over components to hide them from tampering attempts. The second antenna structure can be configured as a continuous conductor between two connection pads. An IC package can then be connected to both of the connection pads. The label can be placed over the second antenna structure so that the continuous conductor is broken if the label is peeled off or manipulated. Logic circuitry (e.g., in a chip of the IC) can detect the break and trigger a lock or alarm.

Consistent with embodiments of the present disclosure, the IC package can be configured with a programmable output that is connected to the second antenna structure. For instance, the programmable output can be driven to a voltage level to detect whether or not the device has been tampered with. The output can be driven in response to an event (e.g., upon power up or upon detection of an external communication signal), periodically or always driven. This can be particularly useful for allowing the second antenna structure to be passively driven by the electromagnetic coupling to the first antenna structure. For example, driving the second antenna structure to a supply voltage can introduce undesired noise caused by fluctuations in the supply voltage.

Turning now to the figures, FIG. 1 depicts a block diagram of a system for RFID transmissions, consistent with embodiments of the present disclosure. IC package 102 houses one or more IC chip(s). The chips include logic circuitry that is configured to provide the functionality of the logic modules/circuitry 106, 108 and 110. RFID transmitter (transceiver) frontend circuitry/module 108 communicates via RF signals received from a connected antenna. During receipt of data, the frontend circuitry 108 can be configured to decode data modulated in an RF carrier. During transmission of data, the frontend circuitry 108 can be configured to encode data by modulating the received (from reader devices) RF carrier signal such that the backscattered RF signal can be decoded by a reader device. For instance, the RF carrier signal can be modulated by varying internal impedance of the frontend circuitry 108. In particular embodiments, the IC package 102 is configured to provide a single frontend circuitry 108. Thus, only one antenna structure is directly driven, with an RF signal, by circuitry in the IC package 102.

Various embodiments are directed toward a tamper protection interface module/circuitry 110 that provides a tamper protection interface. This tamper protection interface module 110 can detect attempts to gain physical access to components of the system. For instance, the interface can detect the effective resistance between two output connection points to detect a break in a conductor.

Processing circuitry/module 106 provides various functionality including, but not limited to, data handling and security for baseband access to data stored in a local memory. This processing can include disabling memory access in response to detecting tampering, encryption/decryption algorithms and decoding and encoding data communicated over the RFID interface 108. Data communicated with the RFID interface 108, whether transmitted to or received from, can be converted between baseband and RF frequencies. Moreover, the RFID interface can modulate and/or demodulate the communicated data according to the particular transmission protocol(s).

Carrier/substrate 104 is configured to interface with IC package 102 and to provide two antenna structures. For instance, a first antenna structure is connected to the IC package 102 at connection points 112 and 114 and a second antenna structure is connected to the IC package 102 at connection points 116 and 118. Substrate 104 can include one or more layers, each layer providing one or more of routing space for interconnections and/or power-planes. For instance, a design could include a two layer substrate. The two layers could be metal (e.g., copper) layers on the front and the back of the substrate. From these layers component footprints, vias, and traces can be formed by etching away the metal. In certain embodiments, the antenna structures can be constructed from conductors located on the same layer of the substrate 104.

Substrate 104 can include a footprint that corresponds to the output connections for the IC package 102. For instance, the footprint can correspond to a surface mount layout (e.g., thin small-outline packages (TSOPs), Small Outline Transistor packages (SOTs), flip chip strap packages (FCSs), etc.). In certain instances, solder connections/balls 120 connect the carrier 104 to the IC package 102.

Consistent with embodiments of the present disclosure, a device includes the substrate 104 as a printed circuit board in which the first antenna structure is configured and arranged to produce a first radiation pattern. This radiation pattern has nulls. For instance, the first antenna structure can be configured as a dipole antenna having nulls along a common axis of the dipole antenna. Connection pads on the substrate 104 are configured and arranged to transmit RF signals between the IC package 102 to the first antenna structure by providing a current path. This can result in a directionally-limited radiation pattern, which would otherwise force a user of the device to properly orient the device relative to a reader device. Accordingly, a second antenna structure is configured and arranged to receive the RF signal. The second antenna structure is also electromagnetically coupled to the first antenna structure and to produce a second radiation pattern that complements the nulls in the first radiation pattern. For instance, the second antenna structure can be configured to run perpendicular to the first antenna structure and in close enough proximity to provide near-field antenna coupling. The length and orientation of the second antenna structure provides a second radiation pattern that complements the first radiation pattern by providing antenna gain at the nulls of the first radiation pattern. In a particular instance, the nulls are located on a common axis and the second antenna structure is substantially perpendicular to this common axis.

More particular embodiments are directed toward the configuration and use of the second antenna structure to provide tamper detection. The tamper detection can be provided by way of a current path along the second antenna structure. The second antenna structure can be configured and arranged to break the current path in response to tampering with the device (e.g., removal of a label breaks a conductive portion of the second antenna structure).

Particular aspects of the present disclosure recognize that such a device can provide near isotropic radiation patterns without the use of a second frequency RFID circuit configured and arranged to generate a second version of the RF signal. For instance, this radiation pattern can be provided without the use of two simultaneous and decoupled dipoles, each of which is connected to a different, dedicated RF frontend, thereby requiring a dual frontend IC. Other aspects of the present disclosure recognize that even where such dipoles are oriented perpendicular to each other, if such an antenna structure is connected to the single frontend (via galvanic or magnetic coupling), the radiation pattern merely rotates and does not substantially complement the nulls (e.g., preserving the shape, typically a donut shape for dipole antennas, of the first radiation pattern).

Figure 2:
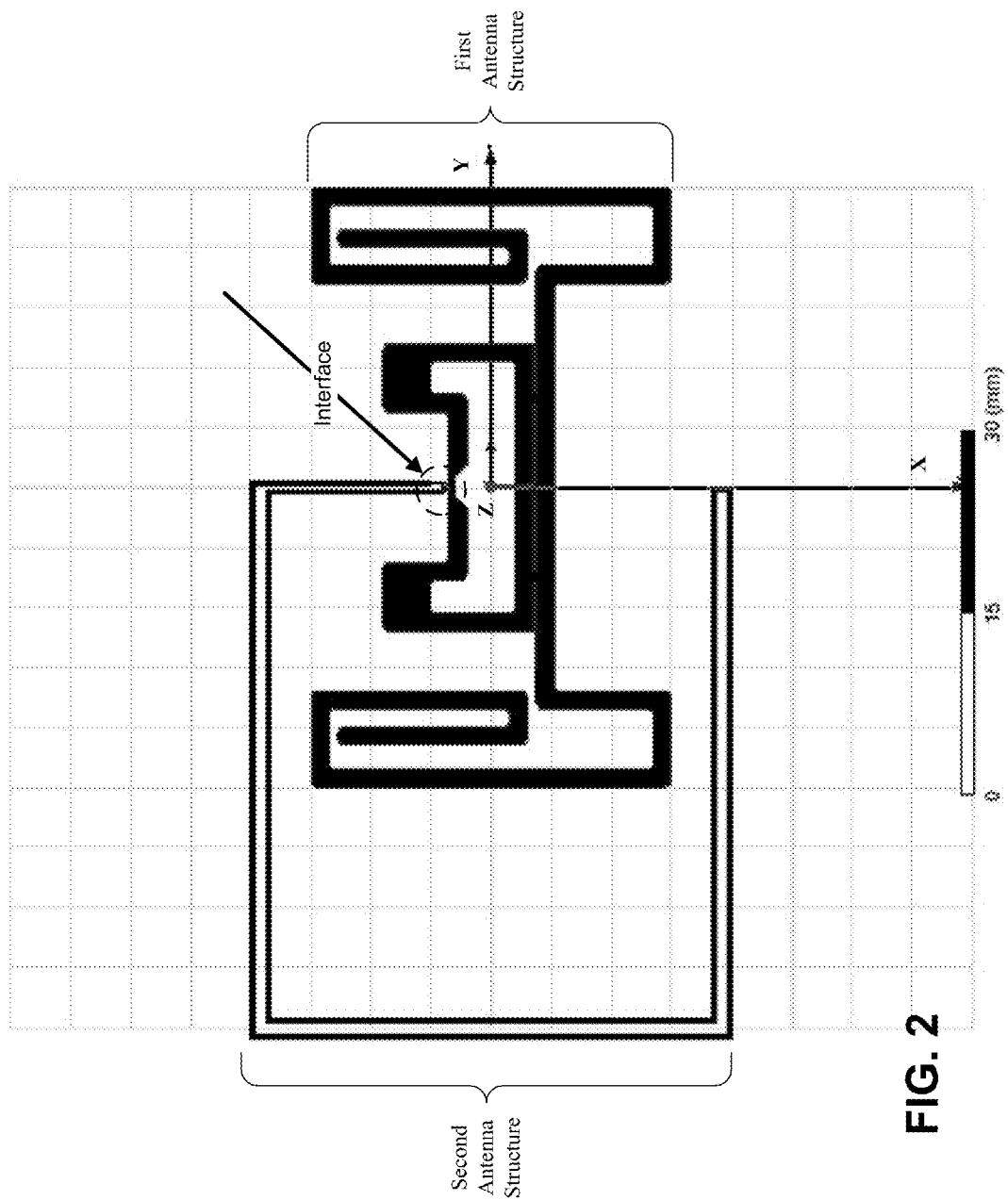
FIG. 2 depicts a top-down view of antenna structures on a carrier, consistent with embodiments of the present disclosure.

FIG. 2 depicts a top-down view of antenna structures on a carrier, consistent with embodiments of the present disclosure. The first antenna structure operates as a dipole antenna with nulls in the Y direction, with the antenna radiation pattern providing adequate antenna gain in both the X direction and Z direction, which extends vertically from the image. The first antenna structure includes a pair of connection pads located within the dotted circle indicated by the interface arrow. An IC package with a (single) frontend communication circuit can be placed at this interface such that the first antenna structure is directly connected thereto (e.g., driven by impedance-based modulation from the frontend circuit).

A second antenna structure includes a conductive portion that is substantially perpendicular to the Y axis, upon which the nulls are located. This portion is located sufficiently close to the first antenna structure to allow electromagnetic coupling and to thereby produce a radiation pattern that complements the nulls. This combination of radiation patterns from the antenna structures results in a radiation pattern that is substantially more isotropic and directionally insensitive. The second antenna structure also includes a pair of connection pads located within the dotted circle indicated by the interface arrow. An IC package can be placed at this interface; however, the second antenna structure has no current path to a transmitter frontend circuit. This connection, however, can provide tamper protection/detection as discussed herein.

The scale provided in FIG. 2 provides an example of the dimensions for the first and second antenna structures relative to an RFID circuit operating in the UHF frequency range of about 300 MHz to 3 GHz. More particular embodiments relate to an RFID circuit operating in the 860 MHz to 960 MHz frequency range. The embodiments discussed herein, however, are not necessarily limited to this specific size and can be adjusted according to the particular application. The specific shape of the first antenna structure can also be modified consistent with different dipole antenna designs.

Figure 3:
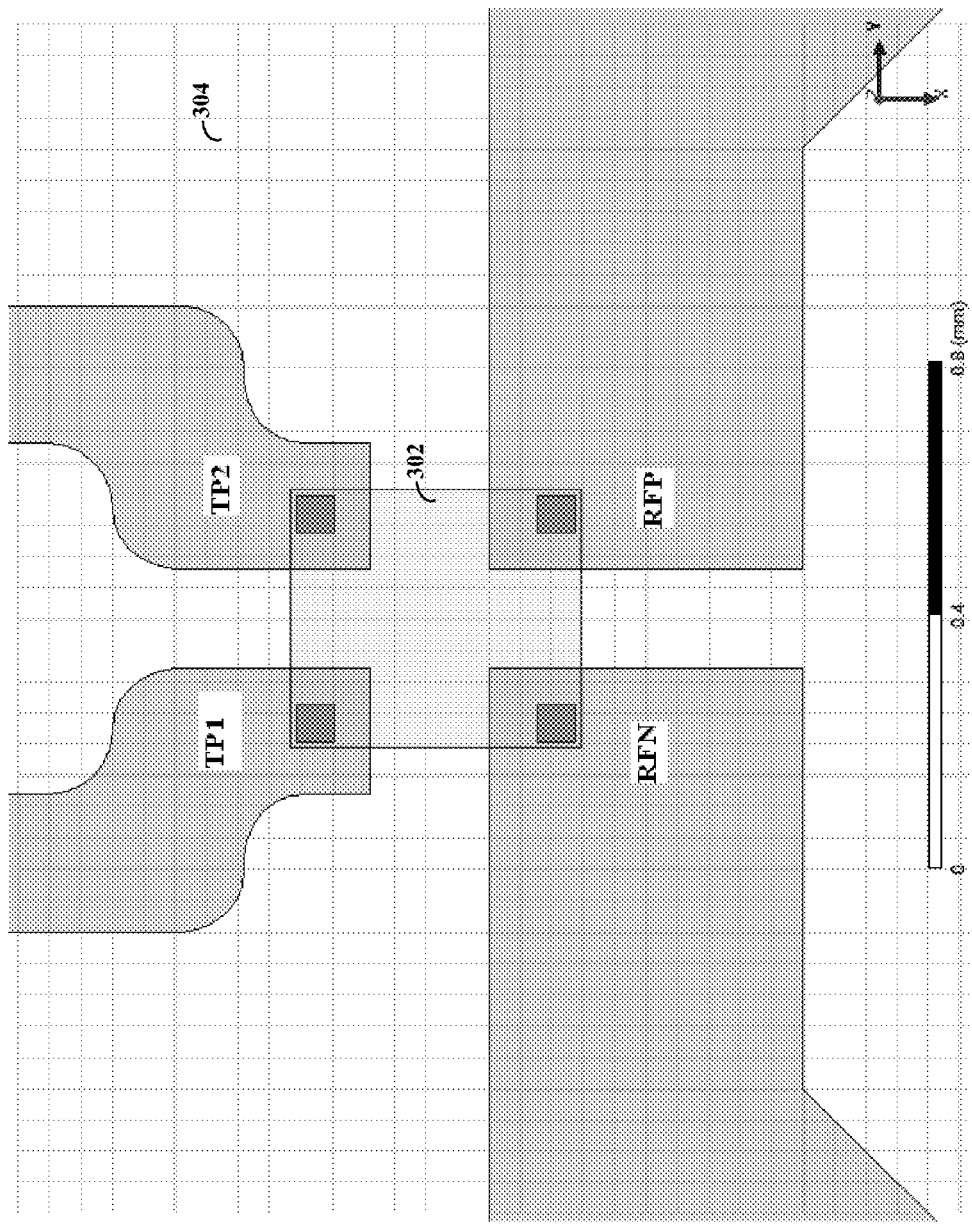
FIG. 3 depicts an interface portion for connecting between a substrate structure and an IC package, consistent with embodiments of the present disclosure.

FIG. 3 depicts an interface portion for connecting between a carrier and an IC package, consistent with embodiments of the present disclosure. IC package 302 can be placed on the carrier 304, which includes four connection points. Two connection points, RFN and RFP, are part of the first antenna structure and can be directly driven by the IC package 302 at RF frequencies. The other two connection points, TP1 and TP2, are part of the second antenna structure and do not need to be directly driven at RF frequencies. The scale provided in FIG. 3 provides an example of the dimensions for the first and second antenna structures relative to an RFID circuit operating in the UHF frequency range. The embodiments discussed herein, however, are not necessarily limited to this specific size and can be adjusted according to the particular application.

Figure 4:
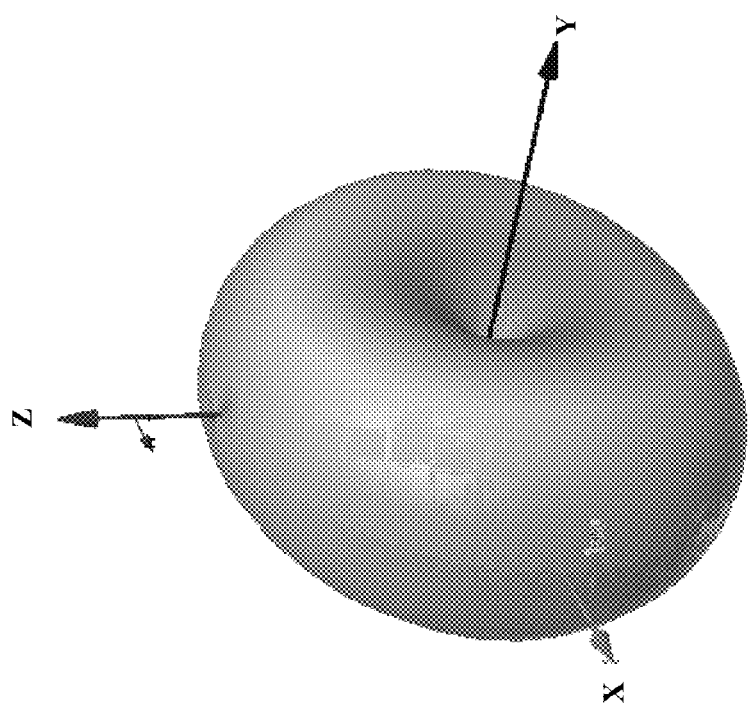
FIG. 4 depicts a radiation pattern with nulls, consistent with embodiments of the present disclosure.

FIG. 4 depicts a radiation pattern (at 915 MHz) with nulls, consistent with embodiments of the present disclosure. The radiation pattern of FIG. 4 has a donut shape with its "hole" being located along the Y axis. This radiation pattern corresponds to a radiation pattern produced by a dipole antenna, such as the first antenna structure shown in FIG. 2. The radiation pattern has an adequately strong gain (and corresponding tag sensitivity) in both the X and Z directions; however, the radiation along the Y axis is an effective null. This results in the corresponding device being directionally sensitive and thereby may force a user to properly orient the device before it can be used to communicate.

Figure 5:
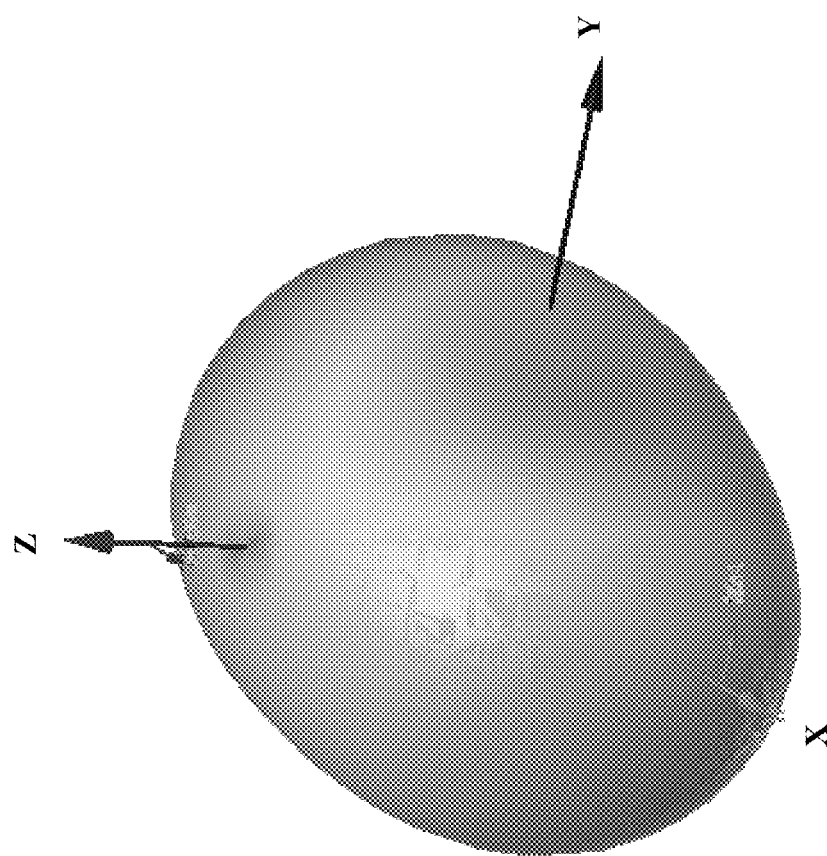
FIG. 5 depicts a radiation pattern in which the nulls have been complemented, consistent with embodiments of the present disclosure.

FIG. 5 depicts a radiation pattern (at 915 MHz) in which the nulls have been complemented, consistent with embodiments of the present disclosure. The radiation pattern of FIG. 5 has significantly improved antenna gain (and corresponding tag sensitivity) along the Y axis, relative to the donut shape of FIG. 4. This improvement corresponds to a complementing radiation pattern generated by a second antenna structure as discussed herein. Although the antenna gain along the Y axis may not be identical to the antenna gain along the X axis (and thus perfectly isotropic), it is substantially improved relative to the nulls existing in FIG. 4.

Figure 6:
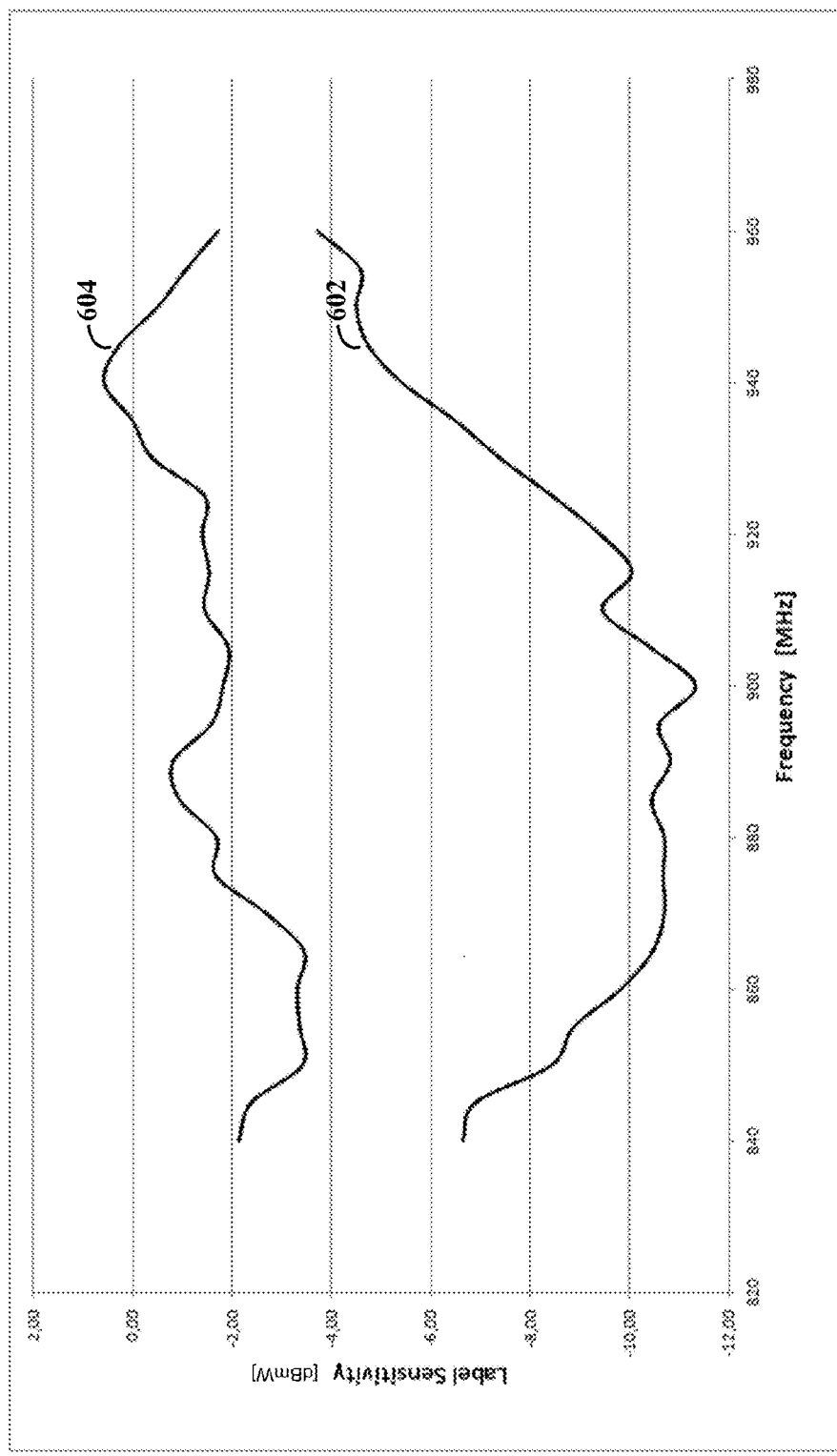
FIG. 6 depicts experimental tag sensitivities plotted against frequency for devices oriented along the direction of nulls relative to a dipole antenna structure, consistent with embodiments of the present disclosure.

FIG. 6 depicts experimental label sensitivity plotted against frequency for devices oriented along the direction of nulls relative to a dipole antenna structure, consistent with embodiments of the present disclosure. The depicted parameter, dBmW, refers to the power ratio in decibels (dB) of the measured power referenced to one milliwatt (mW) (e.g., 30 dBmW=30 dB over 1 mW; or −10 dBmW=−10 dB over 1 mW) and is shown for each of the depicted frequencies between 840 MHz and 960 MHz. Accordingly, smaller values of dBmW represent good tag sensitivity (or alternatively, good antenna gain). Label sensitivity plot 604 represents a dipole antenna structure without a second antenna structure providing complementary antenna gain. Label sensitivity plot 602 represents a dipole antenna structure having a second antenna structure that provides complementary antenna gain, consistent with embodiments of the present disclosure.

The signals and associated logic and functionality described in connection with the figures can be implemented in a number of different manners. Unless otherwise indicated, various general-purpose systems and/or logic circuitry may be used with programs in accordance with the teachings herein, or it may prove convenient to use a more specialized apparatus to perform the disclosed aspects. For example, according to the present disclosure, one or more of the methods can be implemented in hard-wired circuitry by programming a general-purpose processor, a digital signal processor (DSP), other fully or semi-programmable logic circuitry, and/or by a combination of such hardware and a general-purpose processor configured with software. Accordingly, the various components and processes shown in the figures can be implemented in a variety of circuit-based forms, such as through the use of data processing circuit modules.

It is recognized that aspects of the disclosure can be practiced with circuits and computer/processor-based system configurations other than those expressly described herein. The corresponding structure for a variety of these systems and circuits would be apparent from the intended application and the above description.

The various terms and techniques are used by those knowledgeable in the art to describe aspects relating to one or more of communications, protocols, applications, implementations, and mechanisms. One such technique is the description of an implementation of a technique expressed in terms of an algorithm or mathematical expression. While such techniques may be implemented, for example, by executing code on a computer processor, the expression of that technique may be conveyed and communicated as a formula, algorithm, or mathematical expression.

For example, a block or module denoting "C=A+B" as an additive function implemented in hardware and/or software would take two inputs (A and B) and produce a summation output (C), such as in combinatorial logic circuitry. Thus, the use of formula, algorithm, or mathematical expression as descriptions is to be understood as having a physical embodiment in at least hardware (such as a processor circuit in which the techniques of the present disclosure may be practiced as well as implemented as an embodiment).

In certain embodiments, machine-executable instructions are stored for execution in a manner consistent with one or more of the methods of the present disclosure. The instructions can be used to cause a general-purpose or special-purpose processor that is programmed with the instructions to perform the steps of various methods. The steps may be performed by specific hardware components that contain hardwired logic for performing the steps, or by any combination of programmed computer components and custom hardware components.

In some embodiments, aspects of the present disclosure may be provided as a computer program product, which may include a machine or computer-readable medium having stored thereon instructions, which may be used to program a computer (or other electronic devices) to perform a process according to the present disclosure. Accordingly, the computer-readable medium includes any type of media/machine-readable medium suitable for storing electronic instructions.

Various modules may be implemented to carry out one or more of the operations and activities described herein and/or shown in the figures. In these contexts, a "module" is a circuit that carries out one or more of these or related operations/activities. For example, in certain of the above-discussed embodiments, one or more modules are discrete logic circuits or programmable logic circuits configured and arranged for implementing these operations/activities, as in the circuit modules shown in FIG. 1. In certain embodiments, the programmable circuit is one (or more) computer circuits programmed to execute a set (or sets) of instructions (and/or configuration data). The instructions (and/or configuration data) can be in the form of firmware or software stored in and accessible from a memory (circuit). As an example, first and second modules include a combination of a CPU hardware-based circuit and a set of instructions in the form of firmware, where the first module includes a first CPU hardware circuit with one set of instructions and the second module includes a second CPU hardware circuit with another set of instructions.

The various embodiments described above are provided by way of illustration only and should not be construed to limit the disclosure. Based on the above discussion and illustrations, those skilled in the art will readily recognize that various modifications and changes may be made to the present disclosure without strictly following the exemplary embodiments and applications illustrated and described herein. Such modifications and changes do not depart from the true spirit and scope of the present disclosure, which is set forth in the following claims.

What is claimed is:

1. A device for use with a radio frequency identification (RFID) chip that receives and modulates a radio frequency (RF) signal, the device comprising:
    a substrate having:
        a first short dipole antenna structure configured and arranged to backscatter a received RF signal to produce a first radiation pattern having nulls;
        a set of connection pads configured and arranged to couple the RF signal from the antenna to a frontend transmitter circuit of the RFID chip that is configured to backscatter the received RF signal by actively driving the first short dipole antenna structure; and
        a second antenna structure configured and arranged to backscatter the received RF signal in response to being passively driven by electromagnetic coupling to the first antenna structure to produce a second radiation pattern that introduces antenna gain that complements the nulls in the first radiation pattern.

2. The device of claim 1, wherein the first radiation pattern is a dipole radiation pattern providing antenna gain in two of three directions and the nulls are located on a common axis, the second antenna structure is substantially perpendicular to the common axis, and the second radiation pattern as combined with the first radiation pattern corresponds to an overall radiation pattern that is isotropic and directionally insensitive and wherein the second radiation pattern does not include gains due to the device actively-driving the second antenna structure.

3. The device of claim 1, wherein the first radiation pattern is a dipole radiation pattern, the nulls are located on a common axis and the second antenna structure is substantially perpendicular to the common axis, wherein in the substrate the second antenna structure is characterized by a length and orientation and is arranged relative to the first antenna structure in sufficiently close enough proximity to the first antenna structure to provide near-field antenna coupling between the first antenna structure and the second antenna structure, thereby providing the second radiation pattern to complement the first radiation pattern by providing antenna gain at the nulls of the first radiation pattern, wherein the first radiation pattern combined with the second radiation pattern provide antenna gain in three directions.

4. The device of claim 1, wherein the second antenna structure is further configured and arranged to provide tamper detection by providing a current path along the second antenna structure, the current path configured and arranged to break in response to tampering with the device.

5. The device of claim 1, further including a protection label and wherein the second antenna structure is further configured and arranged to provide tamper detection by breaking a portion of the second antenna structure in response to removing the protection label.

6. The device of claim 1, wherein the device includes the radio frequency identification (RFID) chip and does not include a second frequency RFID circuit configured and arranged to modulate the RF signal.

7. The device of claim 1, wherein the device further includes an integrated circuit (IC) package that contains the RFID chip, the IC package including:
   a processing module configured and arranged to process data at baseband;
   an RFID transmitter module configured and arranged to convert data between RF and baseband; and
   a tamper protection module configured and arranged to detect physical tampering with the IC package by detecting a break in a current path provided by the second antenna structure.

8. The device of claim 1, wherein the device further includes an integrated circuit (IC) package that contains the RFID chip and wherein the frontend transmitter circuit is configured and arranged to receive and modulate the RF signal at ultrahigh frequencies (UHF).

9. The device of claim 1, wherein the device further includes an integrated circuit (IC) package that contains the RFID chip and wherein the frontend transmitter circuit is configured and arranged to receive and modulate the RF signal at frequencies between 860 MHz and 960 MHz.

10. The device of claim 1, wherein the substrate is a thin polyethylene terephtalate substrate.

11. A method for providing directionally insensitivity radiation patterns, the method comprising:
   receiving and modulating a radio frequency (RF) signal using a RFID frontend circuit;
   backscattering the modulated RF signal using a first short dipole antenna structure that is configured to produce a first radiation pattern having nulls; and
   backscattering the modulated RF signal in response to being passively driven by electromagnetically coupling a second antenna structure to the first antenna structure to produce a second radiation pattern that introduces antenna gain that complements the nulls in the first radiation pattern.

12. The method of claim 11, wherein the first radiation pattern is a dipole radiation pattern and the nulls are located on a common axis and wherein the second radiation pattern does not include gains due to active-driving of the second antenna structure.

13. The method of claim 11, wherein the first radiation pattern is a dipole radiation pattern, the nulls are located on a common axis and the second antenna structure is substantially perpendicular to the common axis.

14. The method of claim 11, further including a step of detecting physical tampering of a device containing the RFID frontend circuit by providing a current path along the second antenna structure, the current path configured and arranged to break in response to tampering with the device.

15. The method of claim 11, wherein the method does not include the steps of receiving and modulating the RF using another RFID frontend circuit.

16. The method of claim 11, wherein the step of receiving and modulating the RF signal occurs at UHF.

17. The method of claim 11, wherein the step of receiving and modulating the RF signal occurs at frequencies between 800 MHz and 1 GHz.

18. A device for use with a radio frequency identification (RFID) chip that receives and modulates a radio frequency (RF) signal, the device comprising:
   a substrate;
   a first short dipole antenna structure in the substrate and configured and arranged to backscatter a received RF signal to produce a first radiation pattern having nulls;
   a set of connection pads configured and arranged to couple the RF signal from the antenna to a frontend transmitter circuit of the RFID chip; and
   a second antenna structure in the substrate and configured and arranged to backscatter the received RF signal by electromagnetic coupling to the first antenna structure and to produce a second radiation pattern that complements the nulls in the first radiation pattern, wherein in the substrate the second antenna structure is configured and arranged in sufficiently close enough proximity to the first antenna structure to provide near-field antenna coupling between the first antenna structure and the second antenna structure and for the second antenna structure to be passively driven by the electromagnetic coupling and wherein the second antenna structure is characterized by a length and orientation, relative to the first antenna structure, to provide the second radiation pattern that complements the first radiation pattern by providing antenna gain at the nulls of the first radiation pattern.

19. The device of claim 18, further including the RFID chip, wherein the RFID chip includes a signal transmission circuit that is directly connected via a current path to the first antenna structure and not directly connected to the second antenna structure.

20. The device of claim 18, wherein the second radiation pattern as combined with the first radiation pattern corresponds to an overall radiation pattern that is isotropic and directionally insensitive and wherein the first radiation pattern is a dipole radiation pattern and the nulls are located on a common axis and wherein the second radiation pattern does not include gains due to the second antenna structure being actively driven.

* * * * *